ELECTRIC LEAD WIRE BONDING TOOLS

Filed March 31, 1964

2 Sheets-Sheet 1

INVENTOR.
FRANK L. CHRISTENSEN
BY
Bernard Kriegel
ATTORNEYS

INVENTOR.
FRANK L. CHRISTENSEN
BY
Bernard Kriegel
ATTORNEY.

United States Patent Office 3,358,897

Patented Dec. 19, 1967

3,358,897

ELECTRIC LEAD WIRE BONDING TOOLS

Frank L. Christensen, Saratoga, Calif., assignor to Tempress Research Co., Sunnyvale, Calif., a corporation of Utah Filed Mar. 31, 1964, Ser. No. 356,282
17 Claims. (Cl. 228—40)

The present invention relates to tools for attaching electric lead wires to terminal areas, and more particularly to tools for effecting a welding or molecular diffusion of small lead wires to small terminal areas, such as present in semiconductors.

In the manufacture of semiconductors, it is frequently necessary to attach small electric lead wires to small terminal areas. Conventional wiring techniques, such as soldering or mechanical clamping, are not feasible since lead wires are often as small as 0.0007 inch in diameter and the areas to which they must be connected are seldom more than 0.005 inch wide. Attachment of the lead has been performed by "nail head" bonding it to the semiconductor material. This involves threading the lead wires through an orifice or passage of a small tubular tool called a "capillary," which is mounted in a suitable fixture above the area of semiconductor material to which the wire is to be attached. The passage or orifice of the tubular tool is of very small diameter conforming to the size of the wire threaded through it. The semiconductor material rests on a small heated stage or platform which can be moved easily for alignment, the wire first severed a short distance from the orifice of the capillary with a small torch flame that produces a widened end of the wire of generally ball shape. The capillary is then lowered toward the bonding area, contacting the ball end of the wire and shifting it against the semiconductor material, the capillary pressing or "nail heading" the balled end of the wire against the semiconductor material. The conditions of temperature and pressure produced by this action in a few seconds cause a molecular diffusion or welding of the lead wire and semiconductor material. After the bond has been completed, the capillary is retracted upwardly, the wire again severed and the process can then be repeated on a new bonding area. It is desirable to perform the above-described process with the semiconductor material and the capillary both in a heated state, since a better bond is thereby secured.

Prior tubular tools or capillaries possess serious disadvantages. The orifice through the tool cannot be produced to close tolerances and without the formation of irregularities or other imperfections in its wall. This increases the tendency of the small diameter wire threaded through the orifice to adhere to its wall and also to pack therein. When plugging occurs, unplugging of the orifice is difficult and oftentimes not possible. Moreover, the prior tools cannot be heated effectively, and, in fact, tend to conduct heat away from the bonding region, militating against the securing of a good bond of the wire to the semiconductor material. In order to unplug the tool, its removal from the equipment and replacement by another tool is necessary, such removal and replacement being relatively difficult, particularly when the tool is at an elevated temperature.

Accordingly, it is an object of the present invention to provide an electric lead wire bonding tool having an orifice therethrough made to closer tolerances and without burrs, depressions or other irregularities on the wall or surface of the orifice.

Another object of the invention is to provide an electric lead wire bonding tool in which free movement or threading of the wire through the tool orifice is facilitated, and in which the tendency of the wire to adhere to the orifice wall or to pack into the orifice is minimized.

A further object of the invention is to provide an electric lead wire bonding tool having an orifice that is easier to unplug or clear if it becomes impacted or clogged.

An additional object of the invention is to provide an electric lead wire bonding tool of strong, sturdy and accurate construction, having a long, useful life.

Yet another object of the invention is to provide an electric lead wire bonding tool embodying a tip having an orifice through which a wire can be threaded, the tip being easily releasable and replaceable, when desired, despite being subjected to heat and to temperature variations, and being accurately centered in its associated holder or shank.

Still a further object of the invention is to provide an electric lead wire bonding tool of the capillary type, which is a good thermal conductor so as to be capable of effectively transferring or conducting heat to the region at which the wire is being bonded to an associated element.

Another object of the invention is to provide an electric lead wire bonding tool embodying a tip having an orifice through which the wire can be threaded, the tip being easily releasable and replaceable, when desired, with respect to an associated holder and having good contact therewith for efficient heat transfer from the holder to the tip, the latter having good thermal conductivity.

This invention possesses many other advantages, and has other objects which may be made more clearly apparent from a consideration of a form in which it may be embodied. This form is shown in the drawings accompanying and forming part of the present specification. It will now be described in detail, for the purpose of illustrating the general principles of the invention; but it is to be understood that such detailed description is not to be taken in a limiting sense, since the scope of the invention is best defined by the appended claims.

Referring to the drawings.

Figure 6:
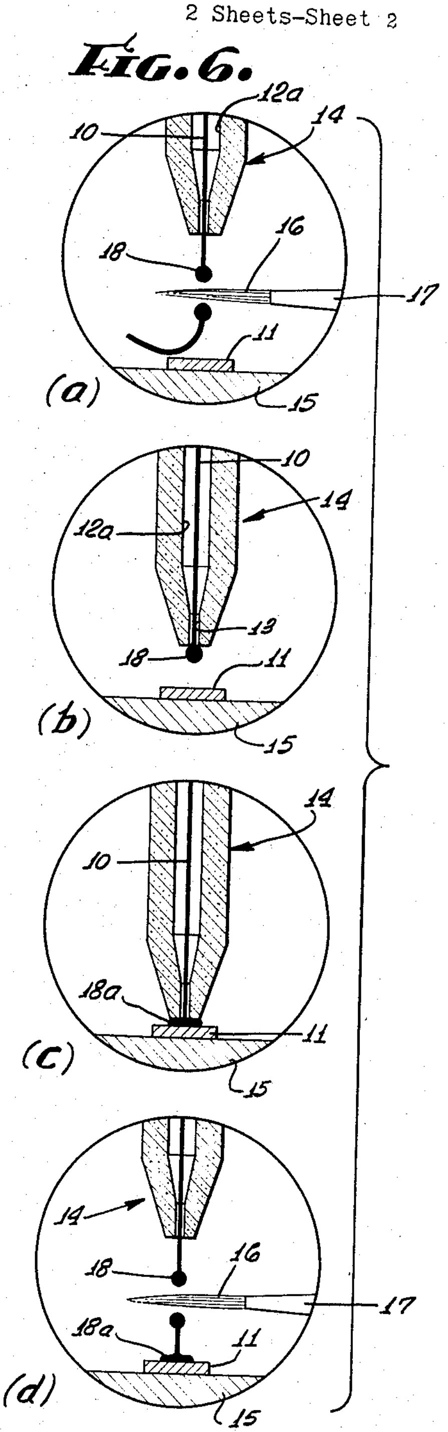

FIGS. 6(*a*), (*b*), (*c*), (*d*) are diagrammatic views illustrating the steps of nail heading an electric lead wire to a semiconductor material.

The tool illustrated in the drawings is adapted to bond an electric lead wire 10 to a semiconductor member 11. The manner in which the bonding is obtained is illustrated in FIG. 6. The electric wire, which is usually of relatively small diameter, often as small as 0.0007 of an inch, and typically 0.001 of an inch, is threaded through the passage 12 and the lower orifice 13 of a tip or tip member 14, the orifice diameter of which is only slightly greater than the diameter of the wire itself. The semiconductor material 11 rests upon a heated stage or platform 15, which may be movable so as to align the semiconductor material with the capillary tip. Typically, the semiconductor material 11 may be no more than 0.005 inch wide. A flame 16 from a suitable gas torch 17 severs the wire 10 by melting, forming a ball or bead 18 at the lower end of the wire projecting downwardly from the capillary tip, as shown in FIG. 6(*a*). The severed wire therebelow is, of course, removed. The capillary tip 14 is then lowered, as shown in FIG. 6(*b*), engaging the ball 18 and pressing it against the semiconductor material 11 with a force sufficient to produce a welding or molecular diffusion of the flattened ball end 18*a* of the lead wire and the semiconductor material, the lower end of the wire 10 assuming a nail head shape, such as disclosed in FIG. 6(*c*). The capillary tip 14 is then elevated along the wire 10 a desired distance and the flame 16 from the torch 17 applied to it to sever the wire 10 and produce another ball shape at its lower end, as shown in FIG. 6(*d*). A new bonding area of semiconductor material 11 can then be shifted into alignment with the electric lead wire 10 and the capillary tip 14, and the steps illustrated in FIG. 6 repeated to secure a bonding of the wire to the semiconductor material.

The entire process for bonding the lead wire 10 to the semiconductor material 11 takes only a few seconds. The action is expedited and the bonding made more secure if the semiconductor is heated by conduction from the heated stage 15 therebelow, and if heat is conducted or transferred downwardly through the capillary tip 14.

As disclosed in FIGS. 1 to 5, inclusive, the tool includes an upper shank or body 20 and the lower tip 14 removably secured to the shank. The shank is appropriately secured to operating equipment (not shown) and is movable to and from the heated stage 15 on which the semiconductor material 11 is supported. The shank 20 includes an upper portion 21, which is preferably made of a heat insulating material, and which has a central passage 22 through which the electric lead wire 10 can be threaded. The lower, reduced diameter end 23 of the upper shank portion is piloted within and is suitably secured to the upper sleeve 24 of a lower, tubular shank portion 25, made of non-magnetic material, such as non-magnetic stainless steel. A pair of diametrically opposed legs 26 are integral with and depend from the upper sleeve 24, these lower legs, in turn, being integral with a lower sleeve, housing or shroud 27 containing a non-magnetic socket member 28 surrounded by a ring magnet 29 disposed within the lower sleeve. The upper end of the ring magnet engages a flange 30 of the socket member or holder 28, which abuts a shoulder 31 at the upper portion of the lower sleeve 27. The lower end 32 of the sleeve 27 is flanged inwardly over the outer end portion of the magnet 29 to secure the latter in place. The ring magnet has its north pole N and its south pole S at its lower end substantially diametrically opposite one another, having been magnetized so as to have the properties of a horseshoe magnet, the lower end face 33 of the magnet ring 29 being exposed and capable of attracting an associated body, which, as disclosed in the drawings, is the tip 14 of the tool, which is capable of being readily mounted within and removed from the holder 28 of the apparatus.

The non-magnetic holder 28 has a frusto-conical tapered bore or socket 34 diverging in a downward direction from the upper end of the holder to its lower end. The tip 14 of the device consists of a main body potrion **14*a* and an insert portion 43. The body portion is made of magnetic material, such as magnetic stainless steel, and has an upper tapered head 35 of frusto-conical shape conforming to the taper of the socket 34 and adapted to enter the latter with the tapered periphery 36 of the head snugly engaging the tapered wall of the socket 34. Below and extending laterally outwardly of the large end of the tapered head, the main body portion of the tip has a flange 37 underlying the lower end 33 of the magnet 29 to be attracted thereby, there being a relatively small gap 38 between the upper surface of the flange and the lower end 33 of the magnet when the tapered head is mounted fully within the socket. As an example, the gap 38 may be of the order of about 0.005 inch. The magnet 29 attracts the flange or armature 37 to retain the tip 14 snugly upwardly within the holder 28. Spaced below the flange 37, the main body portion of the tip may have a pair of opposed slots 39 for the reception of a wrench or other suitable tool (not shown) used in mounting the tapered head 35 in its companion socket 34, or in removing the head therefrom. Such removal is facilitated by providing an extended relief 40** in the periphery of the head between its upper and lower ends, which will insure release under conditions in which the parts may undergo thermal expansion subjected to heat.

The tapered engagement between the head 35 and the wall 34 of the socket insures automatic centering of the tip 14 in the latter. The angle of taper, however, is not so steep as to effect a wedging of the head in the socket. As an example, the included angle of the tapered socket 34 and of the tapered head 35 may be about 17 degrees, which is greater than a self-locking angle. With such degree of taper, a snug fit of the head in the socket is assured, the tip 14, nevertheless, being readily releasable from the socket upon pulling the tip 14 axially outwardly therefrom.

The magnetic main body portion of the tip 14 has the central passage 12 extending downwardly therefrom from its upper end, the upper end 41 of the passage diverging or flaring upwardly to guide the wire 10 into the tip passage 12, which is of substantially greater diameter than the diameter of the wire. The lower end of the body portion of the magnetic tip 14 has a counterbore 41 receiving the upper cylindrical portion 42 of the tip insert 43, which has a passage **12*a* conforming in diameter to the passage 12 through the magnetic body portion and the lower orifice or passage 13 of capillary size that is slightly greater than the diameter of the electric lead wire 10, there being a tapered wall 44 extending from the lower end of the larger passage 12*a* in the tip insert 43 to the orifice or bore 13 at the lower or forward end of the tip insert. The tip insert 43 is suitably secured to the main body of the magnetic tip 14** thereabove in any suitable manner, as by a press-fit or brazing, or the like.

The lower end 45 of the insert at the mouth of its bore or orifice 13 is curved or flared outwardly; whereas, the outer corner 46 of the tip also has a radius, merging into the periphery of the tapered nose portion 47 of the tip insert, which diverges upwardly from the lower end face 48 of the insert toward the upper cylindrical periphery 42 of the insert.

Figures 1, 2, 3:
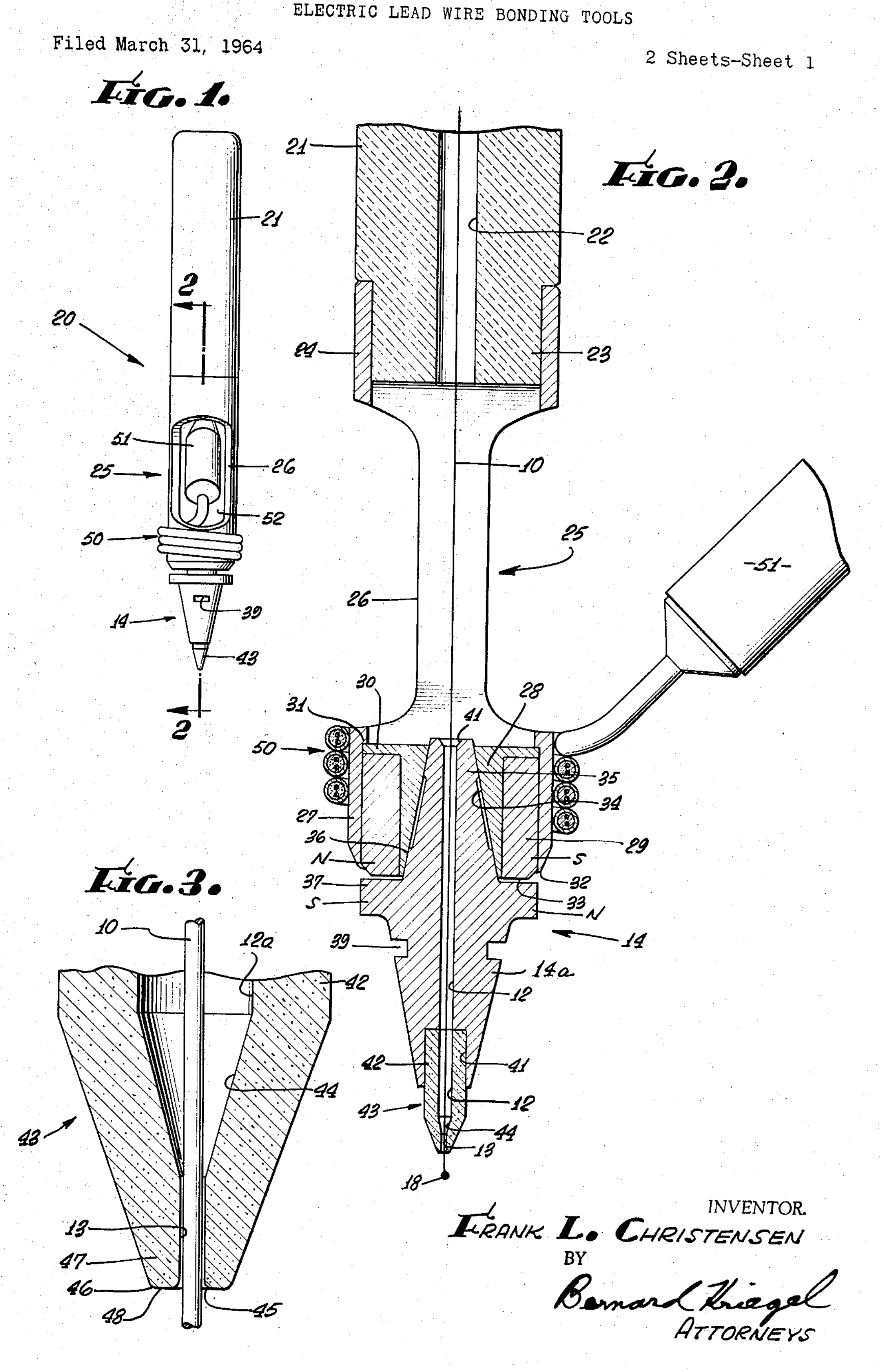
FIGURE 1 is a side elevational view of a lead wire bonding tool embodying the invention.
FIG. 2 is an enlarged longitudinal section taken along the line 2—2 on FIG. 1.
FIG. 3 is an enlarged longitudinal section through the lower or carbide insert portion of the tip of the tool.
Figure 4:
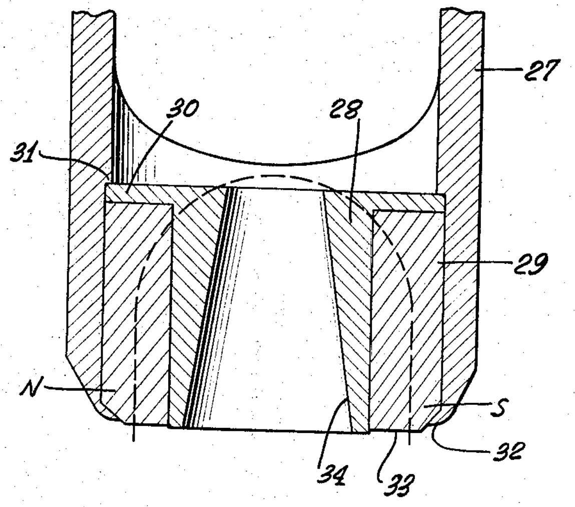
FIG. 4 is an enlarged longitudinal section through the magnet holder portion of the tool, with the tip removed therefrom.
Figure 5:
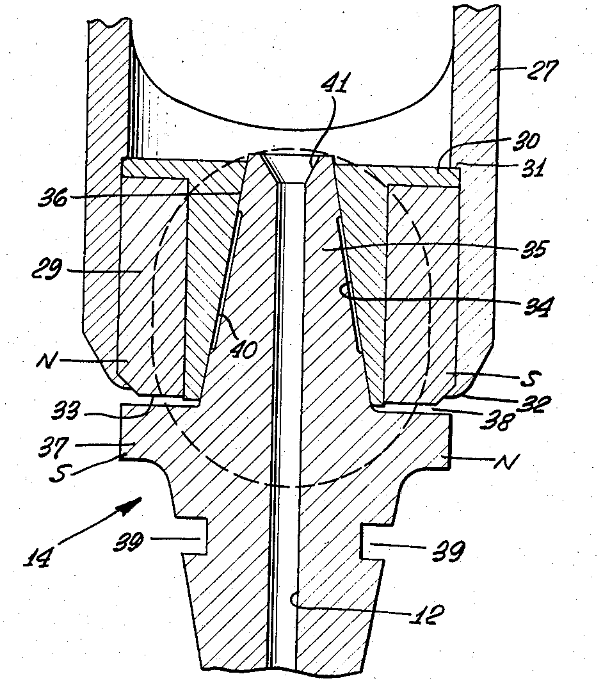
FIG. 5 is a view similar to FIG. 4, illustrating the tip inserted in the holder.

As disclosed in FIGS. 1 and 2, the tip 14 can be heated. A suitable resistance heater coil 50 is wound around the lower sleeve, housing or shroud 27 and is brazed thereto. A pair of wires (not shown) from the heater coil 50 enters a wire junction assembly 51 within which it is suitably connected to a pair of flexible lead wires (not shown) running to a suitable current source.

The skeletonized structure of the lower shank 25 facilitates threading of the wire 10 through the shank and into the tip 14 therebelow. The relatively large windows or openings 52 between the longitudinal shank legs 26 provide ready access for threading of the wire 10 from the shank passage 22 into the tip passage 12. The large areas of the lower shank 25 that are cut away between the legs 26 leave a relatively small cross-sectional leg area through which heat can be transmitted and lost from the heater coil 50. As a result, substantially all of the heat imparted to the housing 27 by the heater coil passes through the ring magnet 29 and holder 28 therewithin to the magnetic tip 14, there being good surface contact between the periphery 36 of the head 35 and the tapered wall 34 of the socket afforded by the holding or attracting force of the magnet 29 on the flange or armature 37 of the magnetic tip. The heat will be conducted downwardly through the magnetic tip 14 and will pass into its tip insert 43, which is also made of good heat conducting material, such as sintered tungsten carbide.

The making of the tip, or at least its insert 43, of a very hard material, such as sintered tungsten carbide, enables the orifice 13 to be made to very close tolerances without the formation of burrs, or other irregularities, in its wall or surface. The orifice or bore can be drilled very accurately and can be highly polished, the absence of the irregularities in the wall or surface of the orifice being due to some extent to the fact that the sintered tungsten carbide is a comparatively dense material. Other materials than sintered tungsten carbide can be used for the tip, such as nickel alloy hardened steels, certain ceramic materials, and synthetic gem materials, like sapphire or ruby. The sintered tungsten carbide or equivalent material enables the orifice or bore 13 to be made with the extreme precision needed, since it can be drilled accurately through the particular material employed. Moreover, the length of the orifice in proportion to its diameter can be relatively low. Thus, the ratio of orifice length to orifice diameter can be about 3 to about 10 to 1. A preferred ratio is about 5 to 1. Because of the relatively short length of the orifice with respect to its diameter, it is easier to thread small diameter wires through it, which may typically be 0.001 inch, and such relatively short orifice is easier to unplug or clear in the event it becomes impacted or clogged by the wire 10 as a result of the pressure bonding of the nail head 18, 18*a* to the semiconductor material 11 during the performance of the operations illustrated in FIG. 6. The sintered tungsten carbide insert 43 has no chemical affinity for the wire usually employed, which is gold or aluminum, facilitating free movement of the wire through the orifice 13 and minimizing the tendency of the wire to adhere to the orifice wall. Since sintered tungsten carbide is much harder than materials heretofore employed as capillary tube wire bonding devices, it has a longer and useful life, resisting wear to a much greater extent. Morever, sintered tungsten carbibe is a good thermal conductor, enabling it to transmit the heat derived from the heater coil 50 and passing through the magnetic portion of the tip 14 to the wire 10, so that a better bond is obtained. The transmission of adequate heat to the wire prevents loss of heat derived from the heated stage 15 and conducted to the semiconductor material 11, permitting faster bonding to take place which considerably reduces the assembly time of the wire to the semiconductor material.

It is also found that the provision of the radius 45 at the outer end of the orifice 13 at the end face 48 of the tip insert 43 prevents gold or other wire from wedging into the orifice when the head 18 of the wire is compressed against the semiconductor material 11, or corresponding element.

In the event the orifice 13 were to be plugged by the wire, it is a comparatively easy matter to remove the tip 14 from the holder 28, even though the tip may be at an elevated temperature. A suitable wrench or other tool (not shown), is inserted in the wrench slot 39 and the tip moved downwardly. The magnetic attraction occurs between the magnet 29 and the flange 37 of the tip, a relatively small increase in the gap 38 reducing the magnetic force considerably and enabling the tip to be readily freed from the holder. There is no magnetic attraction between the tapered head 35 and the tapered socket 28, since the latter is made of non-magnetic material. Another tip 14 can be inserted readily in place, the head 35 being disposed in the socket 28 and the magnet 29 exerting a sufficient force on the flange 37 to insure snug engagement of the tapered periphery 36 of the head against the tapered wall 34 of the socket. Such snug engagement insures the proper centering of the tip 14 in the shank 20 and also insures good thermal conductivity between the socket 28 and the tip, the heat flowing readily downwardly through the tip 14 and its insert 43 to the wire 10 at the end face 48 of the tip, which is pressed against the ball element 18 to flatten the latter and effect a "nail head" bond of the wire to the semiconductor material 11. The angle of the taper 34, 36, as noted above, is not a self-locking or holding angle, the relieved area 40 of the head preventing self-locking under conditions of expansion resulting from heating of the device by the heating coil 50.

I claim:

1. In a wire lead bonding tool: a tip comprising a sintered tungsten carbide portion, said portion having an end face and a passage including an orifice of substantially constant diameter opening through said end face, whereby wire fed through said passage and its orifice can be pressed by said end face against a companion surface; the length of said orifice being about three to ten times the diameter of said orifice.

2. In a wire lead bonding tool: a tip comprising a main body portion having a passage and a sintered carbide insert of a substantially harder material than said main body portion secured to said body portion and having a passage aligned with said other passage and forming a continuation thereof, said insert passage including an orifice opening through an end face of said insert, whereby wire fed through said passages and said orifice can be pressed by said end face against a companion surface.

3. In a wire lead bonding tool: a tip comprising a main body portion of magnetic material having a passage and a sintered carbide insert secured to said body portion and having a passage aligned with said other passage, said insert passage including an orifice of substantially constant diameter opening through a forward end face of said insert, whereby wire fed through said passages and said orifice can be pressed by said end face against a companion surface; the length of said orifice being about three to ten times the diameter of said orifice.

4. In a wire lead bonding tool: a tip comprising magnetic material and having a forward end face and a passage including an orifice opening through said end face, whereby wire fed through said passage and its orifice can be pressed by said end face against a companion surface; said tip including a head portion tapering in a rearward direction and an armature flange projecting laterally beyond the head portion at its forward end.

5. In a wire lead bonding tool: a tip comprising a main body portion of magnetic material and having a passage and a sintered carbide insert secured to said body portion and having a passage aligned with said other passage, said insert having a forward end face and said insert passage including an orifice opening through said end face, whereby wire fed through said passages and said orifice can be pressed by said end face against a companion surface; the length of said orifice being about three to ten times the diameter of said orifice; said body portion including a head tapering in a rearward direction and an armature flange projecting laterally beyond the head at the forward end of said head.

6. In a wire lead bonding tool: a tip comprising magnetic material and having a forward end face and a passage including an orifice opening through said end face, whereby wire fed through said passage and its orifice can be pressed by said end face against a companion surface; said tip including a head portion tapering in a rearward direction and an armature flange projecting laterally beyond the head portion at its forward end; said head portion having a peripheral groove between its upper and lower ends providing a relieved region.

7. In a wire lead bonding tool: a shank member; a magnet carried by said shank member; a tip member comprising magnetic material and having a forward end face and a longitudinal passage therethrough including an orifice opening through said end face, whereby wire fed through said passage and its orifice can be pressed by said end face against a companion surface; one of said members carrying a socket; the other of said members having a head disposed in said socket with a portion of said tip member adjacent to said magnet, whereby said magnet retains said tip member assembled to said shank member.

8. In a wire lead bonding tool: a shank carrying a socket; a magnet carried by said shank; a tip comprising magnetic material and including a head in said socket, a portion of said tip being disposed adjacent to said magnet, whereby said magnet retains said tip assembled to said shank; said tip having a forward end face and a longitudinal passage therethrough including an orifice opening through said end face, whereby wire fed through said passage and its orifice can be pressed by said end face against a companion surface.

9. In a wire lead bonding tool: a shank carrying a tapered socket; a magnet carried by said shank; a tip comprising magnetic material and including a tapered head in said socket, a portion of said tip being disposed adjacent to said magnet, whereby said magnet retains said tip assembled to said shank; with the periphery of said tapered head snugly engaging the tapered wall of said socket; said tip having a forward end face and a longitudinal passage therethrough including an orifice opening through said end face, whereby wire fed through said passage and its orifice can be pressed by said end face against a companion surface.

10. In a wire lead bonding tool: a shank of non-magnetic material carrying a downwardly opening socket; a magnet carried by said shank adjacent to said socket; a tip comprising magnetic material and having a head movable upwardly into said socket and an armature flange extending laterally beyond said head adjacent to and underlying said magnet to be attracted thereby to retain said head in said socket; said tip having a portion for pressing wire against a companion surface.

11. In a wire lead bonding tool: a shank of non-magnetic material carrying a socket; a magnet carried by said shank adjacent to said socket; a tip comprising magnetic material and having a head disposed in said socket and an armature flange extending laterally beyond said head adjacent to said magnet to be attracted thereby to retain said head in said socket; said tip having a forward end face and a passage including an orifice opening through said end face, whereby wire fed through said passage and its orifice can be pressed by said end face against a companion surface.

12. In a wire lead bonding tool: a shank of non-magnetic material carrying a tapered socket; a magnet carried by said shank and surrounding said socket; a tip comprising magnetic material and having a tapered head companion to and disposed snugly in said socket, said head having an armature flange extending laterally beyond said head adjacent to said magnet to be attracted thereby to retain said head in said socket; said tip having a forward end face and a passage including an orifice opening through said end face, whereby wire fed through said passage and its orifice can be pressed by said end face against a companion surface.

13. In a wire lead bonding tool: a shank of good heat conductivity carrying a socket in its lower portion; a tip having good heat conductivity removably mounted in said socket and having a portion for pressing wire against a companion surface; means for removably supporting said tip in said socket; heating means on the exterior of the lower portion of said shank; said shank having longitudinal, circumferentially spaced legs above its lower portion defining large openings above its lower portion to reduce conduction of heat upwardly from said lower portion.

14. In a wire lead bonding tool: a shank of good heat conductivity carrying a tapered socket in its lower portion; a tip of good heat conductivity including a tapered head disposed in said socket, the taper of said head conforming to the taper of said socket, whereby said head snugly engages said socket; said tip having a forward end face and a passage including an orifice opening through said end face, whereby wire fed through said passage and its orifice can be pressed by said end face against a companion surface; an electric heater surrounding said lower portion of said shank to heat the same and said tip; said shank having openings above its lower portion to reduce conduction of heat upwardly from said lower portion.

15. In a wire bonding tool: a shank of good heat conductivity; a socket having a tapered bore therein mounted in the lower portion of said shank; a magnet surrounding said socket and disposed within the lower portion of said shank; a tip of good heat conductivity having a tapered head conforming in taper to the bore of said socket and snugly engaging the wall of said tapered bore; said tip having a forward end face and a passage including an orifice opening through said end face, whereby wire fed through said passage and its orifice can be pressed by said end face against a companion surface; said tip having an armature flange extending laterally beyond said head adjacent to said magnet to be attracted thereby to retain said head snugly in said socket; an electric heater surrounding and contacting the lower portion of said shank to heat said lower portion, magnet, socket and tip; said shank having openings above its lower portion to reduce conduction of heat upwardly from said lower portion.

16. In a wire lead bonding tool: a shank member; a magnet carried by said shank member; a tip member comprising magnetic material, said tip member having a forward end face and a longitudinal passage therethrough including an orifice opening through said end face, whereby wire fed through said passage and its orifice can be pressed by said end face against a companion surface; one of said members carrying a tapered socket, said socket opening through an end portion of said one of said members, said socket diverging toward said end portion; the other of said members having a head companion to said socket and movable longitudinally into said socket with said tip member adjacent to said magnet, whereby said magnet retains said tip member assembled to said shank member.

17. In a wire lead bonding tool: a tip comprising a hard carbide portion, said portion having an end face and a passage including an orifice of substantially constant diameter opening through said end face, whereby wire fed through said passage and its orifice can be pressed by said end face against a companion surface; the length of said orifice being about three to ten times the diameter of said orifice.

References Cited

UNITED STATES PATENTS

| | | | |
|---|---|---|---|
| 62,941 | 3/1867 | Crosby | 228—54 |
| 1,985,492 | 12/1934 | Frohmuth et al. | 228—55 |
| 2,750,828 | 6/1956 | Wendling | 279—1 |
| 2,912,249 | 11/1959 | Eckold | 279—1 |
| 2,985,954 | 5/1961 | Jones et al. | 29—470.1 |
| 3,083,595 | 4/1963 | Frank et al. | 228—44 |
| 3,250,452 | 5/1966 | Angelucci et al. | 228—3 |

RICHARD H. EANES, Jr., *Primary Examiner.*

JOHN F. CAMPBELL, *Examiner.*

M. L. FAIGUS, *Assistant Examiner.*

Disclaimer 3,358,897.—*Frank L. Christensen*, Saratoga, Calif. ELECTRIC LEAD WIRE BONDING TOOLS. Patent dated Dec. 19, 1967. Disclaimer filed Jan. 16, 1969, by the assignee, *Tempress Research Co.*

Hereby enters this disclaimer to claim 2 of said patent.

[*Official Gazette May 27, 1969.*]